United States Patent
Fainzilber et al.

(10) Patent No.: US 9,614,547 B2
(45) Date of Patent: Apr. 4, 2017

(54) MULTI-STAGE DECODER

(71) Applicant: SANDISK TECHNOLOGIES INC., Plano, TX (US)

(72) Inventors: Omer Fainzilber, Even Yehuda (IL); Eran Sharon, Rishon Lezion (IL); Ishai Ilani, Dolev (IL); Alexander Bazarsky, Holon (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 260 days.

(21) Appl. No.: 14/319,480

(22) Filed: Jun. 30, 2014

(65) Prior Publication Data
US 2015/0381206 A1 Dec. 31, 2015

(51) Int. Cl.
| | |
|---|---|
| *H03M 13/00* | (2006.01) |
| *H03M 13/11* | (2006.01) |
| *G06F 11/07* | (2006.01) |
| *H03M 13/37* | (2006.01) |
| *G06F 11/10* | (2006.01) |
| *H03M 13/15* | (2006.01) |
| *H03M 13/29* | (2006.01) |

(52) U.S. Cl.
CPC ....... *H03M 13/1108* (2013.01); *G06F 11/076* (2013.01); *G06F 11/0727* (2013.01); *G06F 11/1012* (2013.01); *H03M 13/1111* (2013.01); *H03M 13/3707* (2013.01); *H03M 13/1191* (2013.01); *H03M 13/152* (2013.01); *H03M 13/1515* (2013.01); *H03M 13/2957* (2013.01)

(58) Field of Classification Search
CPC .......... H03M 13/1108; H03M 13/611; H03M 13/1111; H03M 13/3707; H03M 13/1191; H03M 13/1515; H03M 13/152; H03M 13/2957; G06F 11/0727; G06F 11/076; G06F 11/1012

See application file for complete search history.

(56) References Cited

U.S. PATENT DOCUMENTS

| | | |
|---|---|---|
| 8,086,931 B2 | 12/2011 | Litsyn et al. |
| 8,291,279 B2 | 10/2012 | Sharon et al. |
| 8,429,468 B2 | 4/2013 | d'Abreu et al. |
| 8,464,123 B2 | 6/2013 | Alrod et al. |

(Continued)

OTHER PUBLICATIONS

Gallager, Robert G., "Low-Density Parity-Check Codes", Cambridge, Mass., 1963, 90 pp.

*Primary Examiner* — Christine Tu
(74) *Attorney, Agent, or Firm* — Toler Law Group, PC

(57) ABSTRACT

A data storage device includes a memory and a decoder. In one embodiment, the decoder includes a bit-flipping stage and a second decoding stage. The decoder is configured to receive data from the memory and to process the received data at the bit-flipping stage to generate first stage result data. The data corresponds to an error correction coding (ECC) codeword of an ECC code. The data is processed at the bit-flipping stage based on parity checks of the error correction code (ECC) code that are not satisfied by the data. The data is processed at the bit-flipping stage without first attempting to decode the received data at the second decoding stage. The decoder is further configured to provide the first stage result data to an input of the second decoding stage and to initiate decoding at the second decoding stage at least partially based on the first stage result data.

70 Claims, 7 Drawing Sheets

(56) References Cited

U.S. PATENT DOCUMENTS

| | | | |
|---|---|---|---|
| 8,635,515 B1 * | 1/2014 | Yeo | H03M 13/2703 |
| | | | 714/785 |
| 8,984,376 B1 * | 3/2015 | Norrie | H03M 13/1142 |
| | | | 714/772 |
| 9,323,611 B2 * | 4/2016 | Chilappagari | G06F 11/1068 |
| 2013/0067140 A1 | 3/2013 | Bisen et al. | |
| 2013/0073924 A1 | 3/2013 | d'Abreu et al. | |
| 2013/0097475 A1 | 4/2013 | Wang et al. | |
| 2013/0151912 A1 | 6/2013 | Sevugapandian | |
| 2013/0227374 A1 | 8/2013 | Desireddi | |
| 2013/0238955 A1 | 9/2013 | d'Abreu et al. | |
| 2013/0305114 A1 | 11/2013 | Olcay et al. | |
| 2014/0157087 A1 | 6/2014 | Yurzola et al. | |

* cited by examiner

MULTI-STAGE DECODER

FIELD OF THE DISCLOSURE

The present disclosure is generally related to decoding data.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

ECC decoding techniques have been developed that provide robust error correction capability. For example, iterative belief-propagation decoding techniques may be used to achieve enhanced correction capability. However, such iterative belief-propagation decoding techniques may have a larger latency and/or may consume more power and processing resources than other, less powerful decoding techniques.

SUMMARY

A decoder includes a preliminary bit-flipping stage that performs one or more iterations of bit-flipping on received data prior to initiating decoding at a second stage of the decoder. Results of the bit-flipping stage, such as reliability data and/or updated bit values, are provided to the second stage. Using the results of the bit-flipping stage enables the second stage (e.g., a low density parity check (LDPC) decoder that uses soft information, and/or a belief-propagation stage) to initiate decoding using a more accurate initial state as compared to using the received data, enabling faster convergence with reduced latency and power consumption of the second stage of the decoder. Because the bit-flipping stage may be implemented with reduced latency and power consumption as compared to the second stage, overall decoding latency and power consumption may be improved.

DETAILED DESCRIPTION

Figure 1:
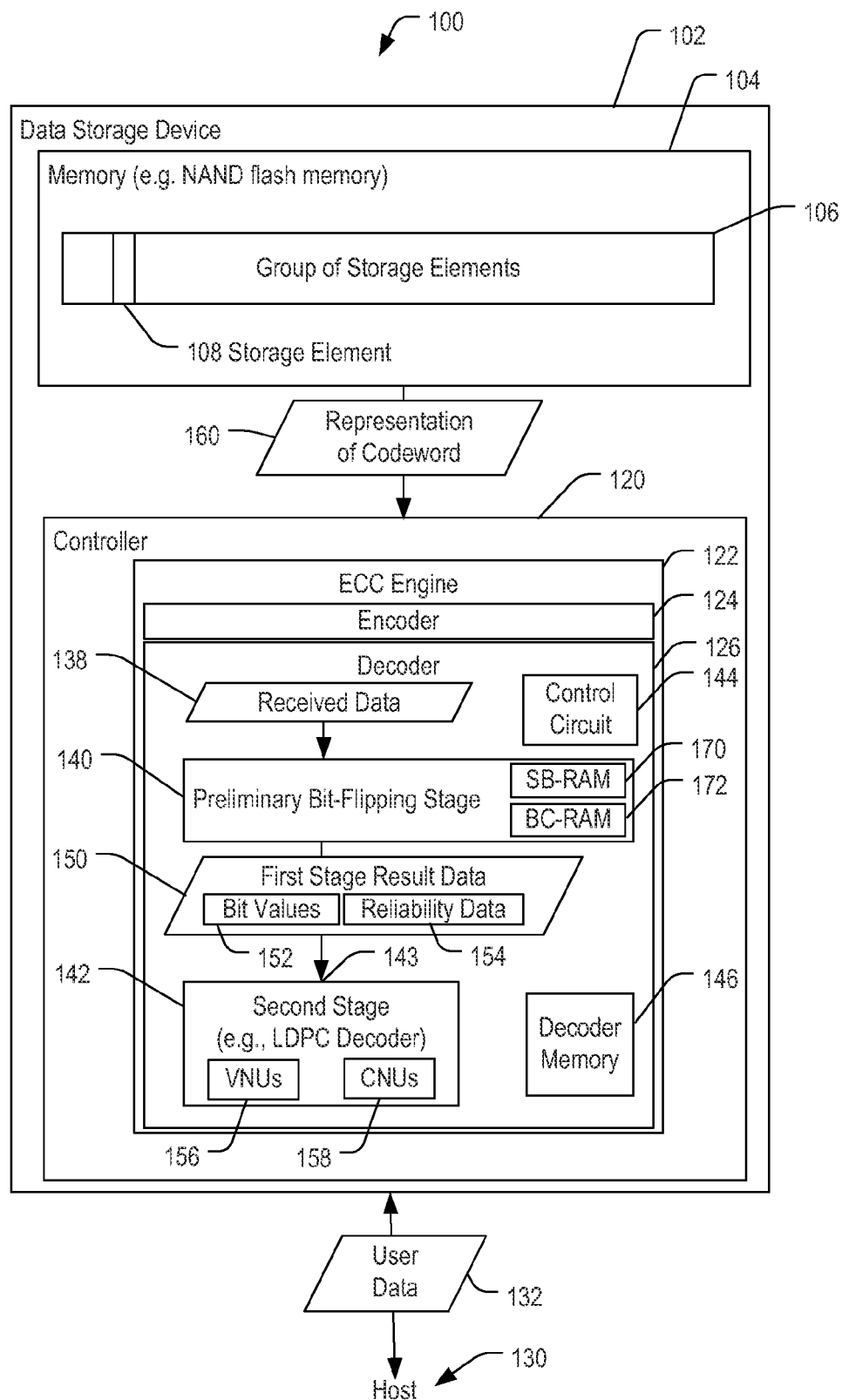
FIG. 1 is a block diagram of a particular illustrative embodiment of a system including a data storage device having a decoder that includes a preliminary bit-flipping stage and a second stage.

Referring to FIG. 1, a particular embodiment of a system 100 includes a data storage device 102 coupled to a host device 130. The data storage device 102 includes a decoder 126 configured to receive data read from a memory 104 and to process the data at a preliminary bit-flipping stage 140 prior to initiating decoding at a second stage 142 that may be configured to use soft information and/or belief-propagation decoding techniques. The decoder 126 may provide the error correction capability of decoding using soft information and/or iterative belief-propagation decoding techniques with reduced latency and power consumption as compared to conventional soft information decoders and/or iterative belief-propagation decoders.

The host device 130 may be configured to provide data, such as the user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes the memory 104 coupled to a controller 120. The memory 104 may be a non-volatile memory, such as a NAND flash memory, and the memory 104 may have a planar configuration or a three-dimensional (3D) configuration, as illustrative, non-limiting examples. To illustrate, the memory 104 may include a non-volatile memory having a three-dimensional (3D) configuration that is monolithically formed in one or more physical levels of arrays of memory cells having an active area above a silicon substrate. The memory 104 may also include circuitry associated with operation of the memory cells, such as read/write circuitry. The memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes an ECC engine 122 that is configured to receive data to be stored to the memory 104 and to generate a codeword. For example, the ECC engine 122 may include an encoder 124 configured to encode data using an ECC encoding scheme or "ECC code", such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 also includes the decoder 126. The decoder 126 is configured to decode data read from the memory 104 to detect and correct, up to an error correction capability of the ECC code, any bit errors that may be present in the data.

The decoder 126 includes the bit-flipping stage 140 and the second stage 142. The decoder 126 may be configured to process received data 138 using the bit-flipping stage 140 as a preliminary decoding stage that precedes the second stage 142. The bit-flipping stage 140 may perform one or more iterations of a bit-flipping process, as described in further detail with respect to FIG. 2.

The decoder 126 may include control circuitry 144, such as dedicated circuitry, one or more state machines, or a hardware processor, as illustrative examples. The control circuitry 144 may be configured to schedule and initiate decoding operations at the bit-flipping stage 140 and at the second stage 142. However, in other implementations, the decoder 126 may not include the control circuitry 144 and one or more operations associated with the control circuitry 144 may instead be implemented by the bit-flipping stage 140, by the second stage 142, by a processor of the controller 120, or a combination thereof. The decoder 124 may also include a decoder memory 146 to store received data and information corresponding to decoding the received data, such as variable node values, check node values, bit positions and counts of bit flips for each bit position, threshold values (e.g., for comparisons to metrics during bit-flipping operations), log likelihood ratios (LLRs), other information corresponding to ECC decoding, or a combination thereof. The decoder memory 146 may be used by the bit-flipping stage 140 and/or by the second stage 142. The decoder memory 146 may be dedicated memory of the decoder 126 or may be included in memory of the controller 120, such as controller random access memory (RAM).

The bit-flipping stage 140 may be a first stage configured to perform one or more iterations of a bit-flipping process on received data prior to attempting to decode the data at the second stage 142. The bit-flipping stage 140 may be configured to process data based on parity checks of the ECC code corresponding to the data. For example, the bit-flipping stage 140 may determine, for each bit of the data, how many parity checks that include the bit are unsatisfied (i.e., parity checks that have a "fail" result indicating incorrect parity among the bits participating in the parity check and signaling that at least one of the participating bits has an incorrect value). As described in further detail with respect to FIG. 2, the bit-flipping stage 140 may be configured to serially scan bit values of the received data to determine, for each bit position, whether to change a corresponding bit value (e.g., "flip" the bit at the bit position).

The bit-flipping stage 140 may include a soft-bits random access memory (SB-RAM) 170 and a "bad" column RAM (BC-RAM) 172. The SB-RAM 170 may be configured to store soft bit information generated when the received data 138 is read from the non-volatile memory 104. For example the SB-RAM 170 may store a value for each bit of received data 138 indicating a reliability of the data or an indication of how close or distant a storage element is to an inter-state boundary. For example, in an implementation where the memory 104 is a flash memory, the soft bit information may be generated by reading flash cell threshold values at a higher resolution than is required to determine a state of the cells. The soft bit information may indicate a proximity of a memory cell's threshold voltage to a boundary voltage between cell states. The BC-RAM 172 may store indices of bad column locations and/or bad bit-line locations of the memory 104 (e.g., indicating columns or bit-lines of the memory 104 that are detected as being associated with unreliable data, such as due to physical defects or error-inducing causes such as over-programming) Information stored in the BC-RAM 172 may be used to indicate reduced reliability of one or more bits of the received data 138.

The bit-flipping stage 140 may be configured to generate first stage result data 150. For example, the first stage result data 150 may include first stage bit values 152 that result after one or more iterations of the bit-flipping process that is applied at the bit-flipping stage 140. In addition, or alternatively, the first stage result data 150 may include first stage reliability data 154 that indicates a reliability corresponding to one or more of the values of the received data 138 that is input to the bit-flipping stage 140 or corresponding to one or more of the first stage bit values 152. To illustrate, the reliability data 154 may include or be based on soft bit information from the SB-RAM 170 and/or may include one or more reliability values determined at least partially according to index value(s) in the BC-RAM 172 (e.g., corresponding to an unreliable column of storage elements). The first stage result data 150 may be provided to an input 143 of the second stage 142.

The second stage 142 may include a low-density parity check (LDPC) decoder that is configured to use soft information (a "soft LDPC decoder"). For example, the second stage 142 may be configured to perform an iterative belief-propagation decoding process on data received at the input 143 of the second stage 142. However, in other implementations, the second stage 142 may not be configured to perform belief-propagation decoding. The data received at the input 143 may include bit values (e.g., "hard" bits indicating a '0' or '1' value per bit position), reliability information (e.g., "soft" bits indicating a reliability or likelihood that a corresponding hard bit value is correct), or a combination thereof. For example, the data may be mapped to variable nodes that represent columns of a parity check matrix associated with an ECC code. A set of check nodes may represent rows of the parity check matrix. An "edge," such as represented in the Tanner graphs illustrated in FIG. 2 as a line connecting a variable node and a check node, indicates a non-zero entry in the parity check matrix at the intersection of the column corresponding to the variable node and the row corresponding to the check node.

The second stage 142 may include circuitry corresponding to multiple variable node units (VNUs) 156 and may be configured to update values of the variable nodes (e.g., data structures in the decoder 126) based on messages from multiple check node units (CNUs) 158. The CNUs 158 may be configured to receive messages (e.g., LLR values) from the VNUs 156 and to generate messages to be sent to the variable nodes. For example, each CNU may be configured to generate, for each variable node participating in the parity check corresponding to the CNU, an LLR value indicating a reliability corresponding to one or more other variable nodes participating in the parity check. Each set of message passing, from variable node to check node and from check node to variable node, may correspond to a decoding iteration of the second stage 142.

The decoder 126 may be configured to process received data at the bit-flipping stage 140 without first attempting to decode the received data at the second stage 142. For example, the decoder 126 may receive a representation 160 of a codeword read from the memory 104 and provide the representation 160 to an input of the bit-flipping stage 140 as received data 138. In some implementations, the received data 138 may vary from the representation 160, such as due to de-scrambling or other processing prior to decoding at the decoder 126.

After performing one or more iterations or partial iterations of a bit-flipping process at the bit-flipping stage 140, the decoder 126 may provide the first stage result data 150 to the input 143 of the second stage 142. By performing preliminary processing at the bit-flipping stage 140, a number of errors may be reduced and/or reliability data may be generated to improve an accuracy of a starting condition for the second stage 142. The bit-flipping stage 140 may operate using a reduced latency and with lower complexity as compared to the second stage 142, and a latency and power consumption introduced by operating the bit-flipping stage 140 may be offset by a reduced number of decoding iterations at the second stage 142 that results from the improved starting condition provided by the bit-flipping stage 140.

During operation, the user data 132 may be received from the host device 130, encoded by the encoder 124 to generate an ECC codeword, and the ECC codeword may be stored in the group 106 of storage elements in the memory 104. In response to receiving a request from the host device 130 to read data, the controller 120 may read the representation 160 of the ECC codeword from the memory 104. The representation 160 may match the ECC codeword or may differ from the ECC codeword due to one or more bit errors (e.g., a bit error that occurred during storage at the memory 104). The controller 120 may provide the representation 160 to be stored in the decoder memory 146 as the received data 138.

The decoder 126 may process the received data 138 using the bit-flipping stage 140 prior to attempting to decode the received data 138 at the second stage 142. The bit-flipping stage 140 may perform one or more iterations of a bit-flipping process, as described in further detail with respect to FIG. 2. If the bit-flipping stage 140 succeeds in decoding the received data 138 (i.e., the received data 138 is a valid ECC codeword or is converted to a valid ECC codeword after one or more iterations of the bit-flipping process), decoding may end without operation of the second stage 142.

If one or more errors remain at the conclusion of the bit-flipping stage 140, the first stage result data 150 may be provided to the input of the second stage 142 (e.g., by updating values in the decoder memory 146 based on the bit-flipping results and scheduling belief-propagation operations to be performed by the second stage 142 on the updated values). Decoding is initiated at the second stage 142 at least partially based on the first stage result data 150. For example, in some implementations, the first stage bit values 152 may be provided as input values to the second stage 142 and may have a fewer number of errors as compared to the received data 138. In other implementations, the received data 138 may be provided as input values to the second stage 142, and the first stage reliability data 154 may be used to indicate a reliability of bit values of the received data 138 (e.g., based on how many times a bit's value was flipped during processing in the bit-flipping stage 140).

If the second stage 142 converges on a valid ECC codeword, a data portion of the codeword may be provided to the host device 130. Otherwise, such as when the second stage 142 does not converge within a predetermined number of iterations, the decoder 126 may signal to the controller 120 that the received data 138 is uncorrectable.

By performing preliminary processing using the bit-flipping stage 140 and using results of the bit-flipping stage 140 to initialize the second stage 142, overall latency and power consumption may be reduced in the decoder 126 even when the bit-flipping stage 140 fails to find a valid ECC codeword. As a result, power consumption and read latency may be improved in the data storage device 102.

Although the decoder 126 is described as processing one or more decoding iterations at the bit-flipping stage 140 and using the first stage result data 150 as input to the second stage 142, the decoder 126 may be implemented to decode data according to one or more other decoding schemes. For example, one embodiment may perform decode processing at the second stage 142 (e.g., at a LDPC decoder) for a number of iterations, and once the syndrome is low enough (e.g., a number of errors in the data is lower than a bit-flipping correction threshold), the decoder 126 may transfer decode processing to the bit-flipping stage 140. In this embodiment, in contrast to embodiments where the bit-flipping stage 140 is not intended to decode the received data 138 and instead is intended to perform lower-power, preliminary processing of the received data 138, the bit-flipping stage 140 may be intended to complete decoding of the partially-decoded data received from the second decoding stage 142 with a lower power consumption as compared to completing decoding at the second decoding stage 142.

In another embodiment, decode processing may alternate between one or more iterations at the bit-flipping stage 140 and one or more iterations at the second decoding stage 142. For example, after performing a first number of iterations (e.g., 1, 2, 3, or any other number of iterations) at the bit-flipping stage 140, the decoder 126 may transfer processing to the second stage 142 to perform a second number of iterations (e.g., 1, 2, 3, or any other number of iterations) at the second stage 142, after which the decoder 126 may transfer processing back to the bit-flipping stage 140 to perform the first number of iterations. The decoder 126 may toggle processing between the bit-flipping stage 140 and the second stage 142 to converge to a valid codeword while saving on total power as compared to decoding the data exclusively at the second stage 142.

As an example, in an embodiment where the bit-flipping stage 140 consumes less power than the second stage 142 but has a lower correction capability than the second stage 142, decode processing of the received data 138 may begin at the bit-flipping stage 140 even though a number of errors in the received data 138 may exceed the correction capability of the bit-flipping stage 140 (but not exceed the correction capability of the second stage 142). The bit-flipping stage 140 may correct some errors (e.g., isolated errors in the data having low reliability values) at reduced power as compared to the second stage 142, and then decoding may be transferred to the second stage 142. After a number of iterations at the second stage 142 correcting errors in the data, a number of remaining errors in the data may be within the correcting capability of the bit-flipping stage 140 (e.g., as indicated by a low syndrome weight), and decoding may be transferred back to the bit-flipping stage 140 for correction of the remaining errors at reduced power as compared to correction of the remaining errors at the second stage 142. As a result, the received data 138 may be decoded using less overall power as compared to decoding the received data 138 exclusively with the second stage 142.

Figure 2:
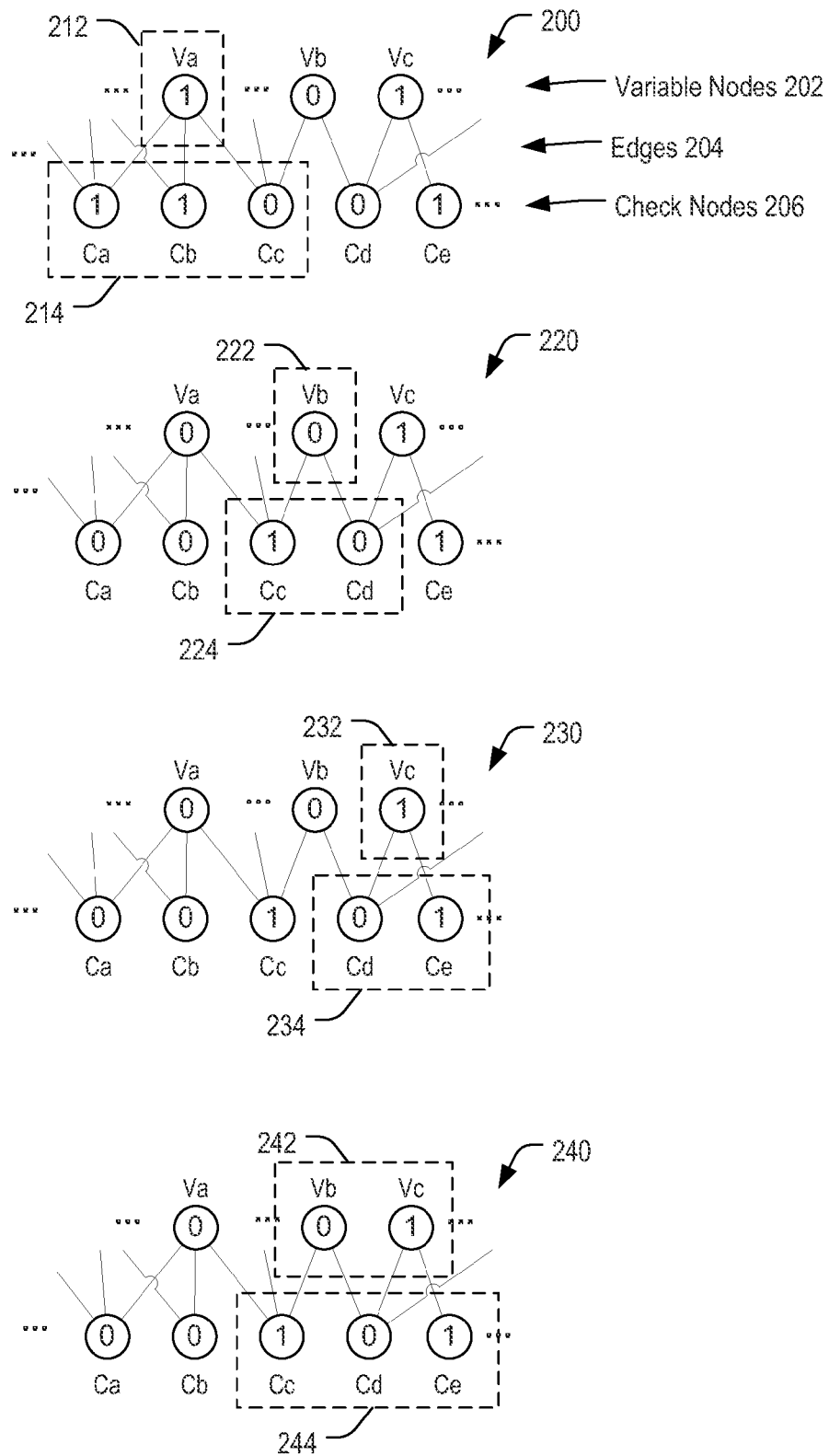
FIG. 2 is a diagram illustrating a particular embodiment of operation of the bit-flipping stage of the decoder of FIG. 1.

FIG. 2 illustrates a particular embodiment of a bit-flipping process that may be performed by the bit-flipping stage 140 of FIG. 1. A first graph 200 (e.g., a Tanner graph) illustrates variable nodes 202 including representative variable nodes Va, Vb, and Vc, check nodes 206 including representative check nodes Ca, Cb, Cc, Cd, and Ce, and edges 204 illustrating connections between the variable nodes 202 and the check nodes 206. Each variable node 202 corresponds to a bit position of data to be decoded and is illustrated as including a bit value (e.g., a '0' value or a '1' value). The variable nodes may include reliability data (e.g., LLRs). The check nodes 206 represent parity check equations (e.g., a check node connected to multiple variable nodes may have a value indicating a result of an exclusive-OR (XOR) of the bit values of the connected variable nodes). The edges 204 indicate which variable nodes 202 participate in which parity check equations. Although illustrated as having three variable nodes 202 and five check nodes 206 for clarity of explanation, any number of variable nodes and check nodes may be included.

In the first graph 200, Va is a currently scanned node 212 of a serial scanning operation. Va participates in parity check equations corresponding to check nodes Ca, Cb, and Cc, illustrated as a group 214 of check nodes responsive to the variable node Va. As illustrated, Ca and Cb have '1' values, corresponding to unsatisfied parity check equations, and Cc has a '0' value, corresponding to a satisfied parity check equation. For example, the parity check equation for each check node 206 may be satisfied when the exclusive-OR (XOR) of the bit values of all variable nodes participating in the parity check equation is '0' and may be unsatisfied when the XOR is '1'. The value of each of the check nodes 206 may be referred to as a "syndrome bit."

A determination is made whether to change the value of the currently scanned node 212 (Va) based on a corresponding threshold number and a metric that corresponds to unsatisfied check nodes of the group 214. For example, the metric may correspond to a count of unsatisfied check nodes in the group 214 (i.e., 2) and the threshold may correspond to one-half of the number of check nodes in the group 214 (i.e., ½ of 3=1.5). Because the metric (2) exceeds the threshold (1.5) for Va, the bit value of the variable node Va is changed from '1' to '0', and the values of each of the check nodes in the group 214 is also changed, as illustrated in a second graph 220.

The second graph 220 illustrates another portion of the serially scanning operation where Vb is a currently scanned node 222. A group 224 of check nodes responsive to Vb includes Cc and Cd. A determination is made whether to change the value of Vb based on a corresponding threshold number and a metric that corresponds to unsatisfied check nodes of the group 224. For example, when the metric corresponds to a count of unsatisfied check nodes in the group 224 (i.e., 1) and the threshold corresponds to one-half of the number of check nodes in the group 224 (i.e., 1), the value of the variable node Vb may be unchanged because the metric does not exceed the threshold.

A third graph 230 illustrates another portion of the serially scanning operation where Vc is a currently scanned node 232. A group 234 of check nodes responsive to Vc includes Cd and Ce. A determination is made whether to change the value of Vc based on a corresponding threshold number and a metric that corresponds to unsatisfied check nodes of the group 234. For example, when the metric corresponds to a count of unsatisfied check nodes in the group 234 (i.e., 1) and the threshold corresponds to one-half of the number of check nodes in the group 234 (i.e., 1), the value of the variable node Vc may be unchanged because the metric does not exceed the threshold.

The serial scanning operation may continue and may include scanning of all variable nodes to complete a first iteration. Serial scanning may be repeated until a threshold number of iterations have been completed. For example, the threshold number may be 1, 2, 3, or any other number of iterations. Serial scanning may be terminated in response to determining that all check nodes 206 are satisfied, indicating that the values in the variable nodes 202 represent a valid codeword. However, the serial scanning operation performed during the bit-flipping stage 140 may not be intended to achieve full decoding of the codeword but may instead be intended to reduce the number of errors in the data. To illustrate, for a large percentage of data words read from the memory 104, full decoding at the second stage 142 may be performed after completion of the bit-flipping processing at the bit-flipping stage 140.

Alternatively, or in addition, the serial scanning operation may be intended to compute initial reliabilities for decoding at the second stage 142. For example, bits that flip values during the bit-flipping state 140 may be assigned lower reliabilities than bits that do not flip during the bit-flipping stage 140.

A fourth graph 240 illustrates another implementation that represents a generalization of the bit-flipping process to sets of multiple variable nodes. A currently scanned group of nodes 242 includes the nodes Vb and Vc, and a group 244 of check nodes includes all check nodes that are responsive to any one or more variable nodes in the group of nodes 242. The variable nodes in the currently scanned group of nodes 242 may be flipped as a group based on a net effect on the check nodes of the group 244.

To illustrate, when the check nodes Cc, Cd, and Ce in the group 244 are equally weighted (or unweighted), flipping variable node Vb independent of Vc would change values of (Cc, Cd) from (1, 0) to (0, 1) but would not reduce the number of unsatisfied parity checks. As a result, Vb may remain unchanged. Similarly, flipping variable node Vc independent of Vb would change values of (Cd, Ce) from (0, 1) to (1, 0) but would not reduce the number of unsatisfied parity checks. As a result, Vc may also remain unchanged.

However, if Vb and Vc are considered together, Vb and Vc may both be flipped to satisfy Cc, Cd, and Ce (i.e., to cause all check nodes in the group 244 to have a '0' value). Determining whether to flip pairs of variable node values may be determined based on the probabilities:

$$Pr(bit_i, bit_j / m \text{ unsatisfied}, n \text{ unsatisfied}),$$

where m is the number of unsatisfied parity check equations that bits participates in and n is the number of unsatisfied parity check equations that $bit_j$ participates in, and the probabilities may be computed for all combinations of whether $bit_i$ and/or $bit_j$ has a correct value or an erroneous value and for all the valid combinations of m and n.

An alternative method of determining whether to flip pairs of variable node values may be based on the characteristic that when values of both variable nodes are flipped, any check node that is responsive to both of the variable nodes remains unchanged (e.g., check node Cd does not change values when Vb and Vc are simultaneously flipped). Thus, check nodes that are responsive to both variable nodes may be ignored when determining whether to flip a pair of variable nodes. For example, the metric that is calculated for one of the variable nodes in the group may exclude at least one check node that is responsive to the variable node and that is further responsive to a second variable node in the group. To illustrate, a determination of whether to flip Vb and Vc may be made based on the values of Cc and Ce, representing the check nodes in the group 244 that change values responsive to flipping Vb and Vc together. For example, a determination of whether to flip variable node Vb may be made based on check node Cc (e.g., a metric may be calculated for Vb based on Ce and excluding Cd), followed by a determination of whether to flip variable node Vc based on check node Ce (e.g., a second metric may be calculated for Vc based on Ce and excluding Ce). In response to a determination that Vb is to be flipped and a determination that Vc is to be flipped, both Vb and Vc may be flipped together.

In some implementations, testing for all pairs of variable nodes may be performed. In other implementations, testing for all pairs of adjacent variable nodes may be performed. Testing for pairs of variable nodes may be limited to pairs of variable nodes that were not determined to be flipped during bit-flipping processing of the variable nodes individually. Although the third graph 240 illustrates generating a bit-flipping decision using a two-variable-node group 242, in other implementations the group 242 may include more than two variable nodes that are processed together.

Various modifications to the serial scanning operation described in the graphs 200, 220, and 230 may be implemented. For example, the threshold may correspond to one-half of the number of parity check equations that are participated in by the variable node. In other implementations, the threshold corresponding to each variable node may be dynamically determined according to an empiric method. To illustrate, the probabilities $$Pr\{\text{bit in error}/i \text{ unsatisfied checks}\} \text{ where } i \in \{0 \ldots d_v\}$$

correspond to the probabilities that a variable node bit is erroneous given that the variable node participates in "i" unsatisfied parity check equations, where $d_v$ is the degree of the variable node (i.e., how many parity check equations the variable node participates in) and where i has a value selected from the set of integers from 0 to $d_v$. These probabilities may be computed according to simulations at a given signal-to-noise ratio (SNR) for every variable node and for each iteration of the serial scanning operation. The threshold for the variable node may be chosen to be the lowest i value where the probability is at least a selected amount (e.g., 0.5). The probabilities may be computed off-line and used to select the thresholds as a function of a SNR during data read from the memory 104.

Another example of an empiric method of dynamically determining the threshold corresponding to each variable node includes computing the threshold according to Equation (1):

$$Q_v = P_v + \sum_c R_{cv} = P_v + (d_v - |S|) \cdot |R| - |S| \cdot |R| = P_v + (d_v - 2 \cdot |S|) \cdot |R| < 0$$

where:

$$P_v = \log_2\left(\frac{1 - BER}{BER}\right),$$

'BER' can be BER from the channel or the current BER during decoding $$|R| = \log_2\left(\frac{1-q}{q}\right),$$

$$q = \frac{1 - (1 - 2 \cdot BER)^{dc}}{2},$$

'BER' here is the current BER during decoding

In this example, $P_v$ corresponds to a LLR of the variable node 'v', $R_{cv}$ is a update message from check node 'c' to the variable node 'v', |S| is a number of unsatisfied checks that 'v' participates in, and BER is a bit error rate. The smallest value of |S| that satisfies the inequality $P_v+(d_v-2\cdot|S|)\cdot|R|<0$ may be chosen as the threshold.

As another example, a density evolution method of dynamic threshold determination may be performed using assumptions that the data is received via a memory-less channel and that the code graph has no cycles. The probability for each bit to be in error may be tracked and an 'average' threshold may be chosen to reduce or minimize a number of bit errors.

As another example, an on-line method of dynamic threshold determination may determine an appropriate threshold according to estimation of the BER during decoding. The estimation of the BER may be determined based on the syndrome weight (the number of unsatisfied parity checks of the entire codeword). Given the estimation of the BER, the threshold may be computed according to Equation (1).

In some implementations, different threshold sets based on different values of SNR may be precomputed. A BER value may be estimated, such as according to an initial syndrome weight that is available at an early stage of decoding. The estimated BER value may be used to select a set of thresholds. In other cases, the threshold sets may be a function of the read state, the logical page containing the read data, or a combination of the read state and the logical page. For example, if a certain bit in a read state is close to a transition point, then its reliability is low and the threshold for flipping such a bit may be set to a predetermined threshold. Another bit which is further from the transition point may be associated with a different predetermined threshold.

Figure 3:
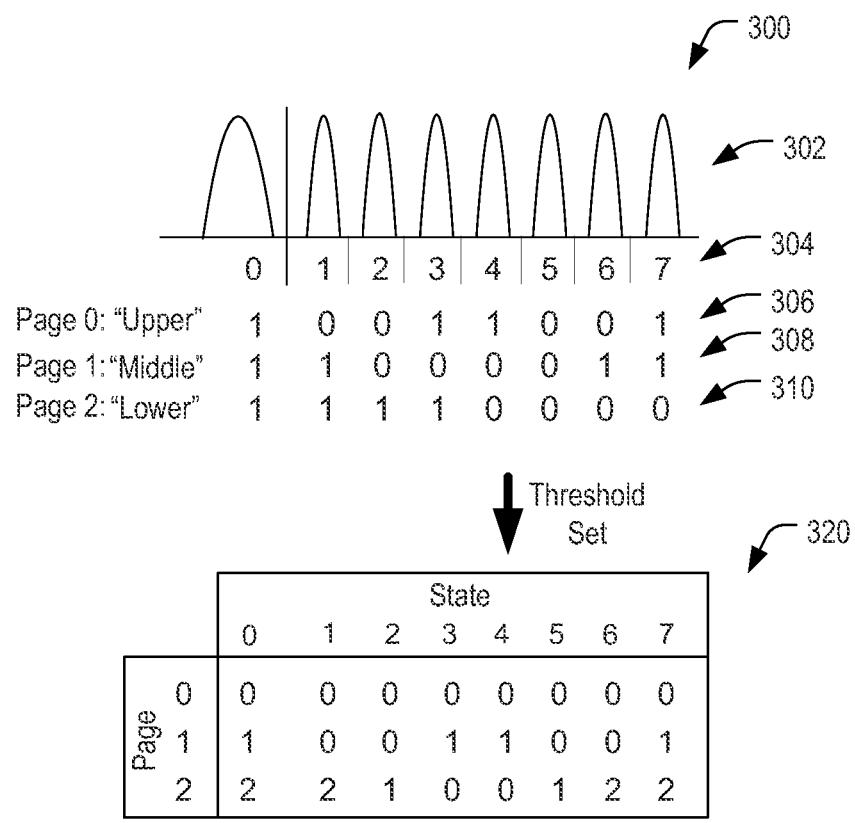
FIG. 3 is a diagram illustrating a mapping of bits to states and a table of threshold sets that may be used at the decoder of FIG. 1.

FIG. 3 depicts an example of a mapping 300 of bit values to storage element states and a table 320 that identifies a particular threshold set for each page/state combination of the storage elements. The mapping 300 graphically depicts a distribution 302 of storage element states (e.g., flash cell threshold voltages) and a state identifier 304 associated with each state in an eight-state-per storage element (or three bits-per-cell (3BPC)) implementation. Each state is associated with a 3-bit value, having one bit corresponding to an "upper" logical page (page 0) 306, one bit corresponding to a "middle" logical page (page 1) 308, and one bit corresponding to a "lower" logical page (page 2) 310. The table 320 includes three different threshold sets (set 0, set 1, and set 2, each set containing one or more thresholds) which may be associated with each page in each state. Optionally, a different threshold set may be associated with each page. The upper page 306 may be associated as a page with the threshold set 0, while for the other pages 308-310 the associated threshold set may be computed as a function of the difference between the states and the transition points in the page. In case a threshold set is defined per state the associated threshold set may be computed as a function of the difference of the various pages in the state from the transition points in their respective page.

For example, the mapping 300 depicts four transition points in the upper page 306: 0-1 (i.e., between state 0 and state 1), 2-3, 4-5, and 6-7. Every state is a distance of one state from a nearest transition point of the upper page 306, and the table 320 assigns threshold set 0 to all states when decoding data in the upper page 306. The mapping 300 depicts two transition points in the middle page 308: 1-2 and 5-6. States 1, 2, 5, and 6 are at a distance of one state from a nearest transition point of the middle page 308, and the table 320 assigns threshold set 0 to these states. States 0, 3, 4, and 7 are at a distance of two states from a nearest transition point of the middle page 308, and the table 320 assigns threshold set 1 to these states. The mapping 300 depicts a single transition point (3-4) in the lower page 310, and the table 320 assigns threshold set 0, 1, or 2 to each state based on its distance from the transition point.

Figure 5:
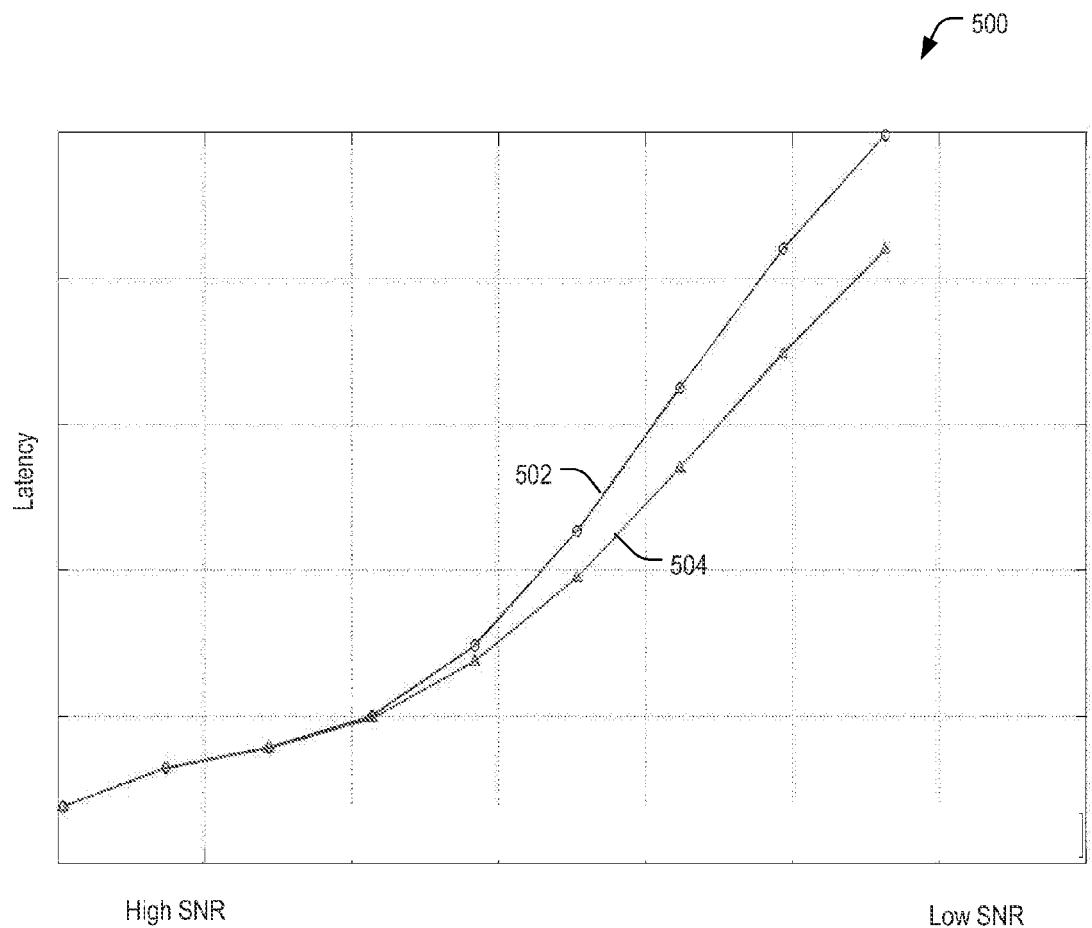
FIG. 5 is a graph illustrating latency associated with the decoder of FIG. 1.

Although FIG. 5 depicts selecting from one of three threshold sets based on a page/state combination, in other implementations threshold sets may be selected based on state and not page (e.g., the table 520 may map each of the eight states 504 to a distinct threshold set of eight predefined threshold sets, independent of page) or based on page and not state (e.g., the table 520 may map each of the three pages 506-510 to a distinct threshold set of three predefined threshold sets, independent of state), as illustrative, non-limiting examples. Other functions may also be considered for computing the threshold sets.

In some implementations, reliability information may be used to determine thresholds. For example, storage elements of "bad" columns of the memory 104 (e.g., indicated by a value stored in the BC-RAM 172 of FIG. 1) may be read as storing a '0' or '1' value independent of the data programmed to the storage elements. Bits with low reliability may be assigned a lower threshold and may be more likely to be flipped. A LLR for such storage elements may be updated to indicate low reliability for determining thresholds. For example, an updated LLR to indicate low reliability for determining thresholds may be provided as the value of $P_v$ of Equation (1). Other types of reliability information may be used to adjust threshold computations. For example, a threshold may be lowered in response to a variable node value changing during a previous iteration of a multi-iteration bit-flipping process, or in response to soft bit information read from the memory 104 indicating lower reliability, as illustrative, non-limiting examples.

Figure 4:
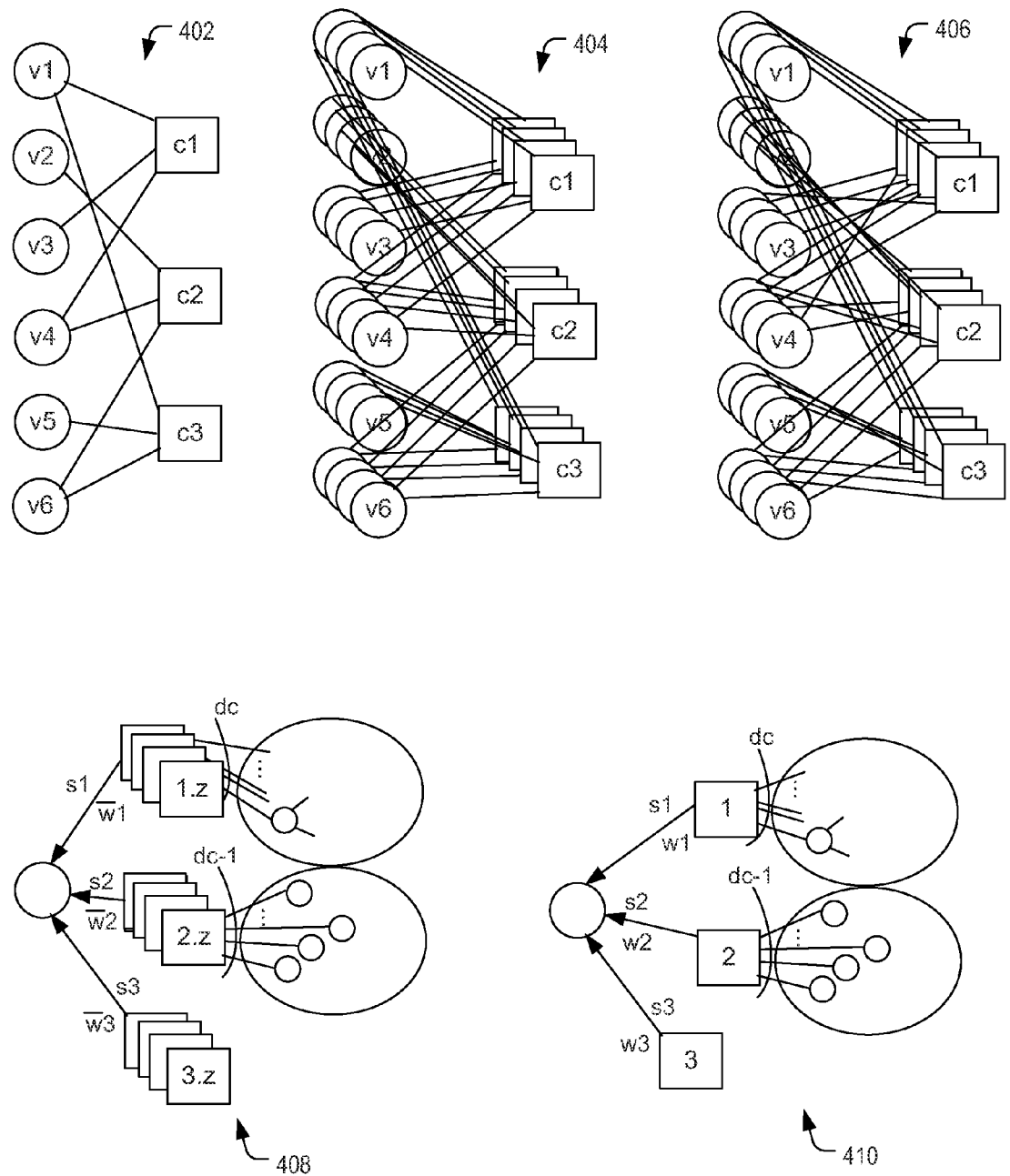
FIG. 4 is a diagram illustrating examples of lifting/quasi-cyclic LDPC structure and node weighting that may be used at the decoder of FIG. 1.

The metric for each variable node may be determined using weights corresponding to check nodes. For example, the graphs 200, 220, 230 of FIG. 2 depict a bit-flipping process that uses no weights (or alternatively, all weights have a '1' value). In this example, the metric corresponds to $$\sum_i s_i$$

where $s_i$ is a check node value for each check node i that the variable node participates in. As another example, 'average' weights may be used, such as generated according to empiric or analytical calculations. In this example, the metric may be determined according to $$\sum_i \overline{w}_i s_i$$

where $\overline{w}_i$ is the average weight that is common for all of the Z lifted check nodes that are lifted from a common check node in an LDPC code implementation based on lifted nodes and having a lifting factor of Z, such as illustrated in FIG. 4.

FIG. 4 illustrates an example of generating an LDPC code based on a lifted graph (quasi-cyclic LDPC (QC-DLPC)) that may be constructed by lifting a relatively small bipartite graph (protograph) 402 by a lifting factor Z such that Z disjoint copies 404 of the protograph 402 are generated. Although the protograph 402 is illustrated as having six variable nodes v1-v6 and three check nodes c1-c3, coupled by edges represented by lines, for ease of explanation, a protograph used to generate a QC-DLPC code implemented by the decoder 126 of FIG. 1 may include more than six variable nodes and three check nodes.

Each lifted edge of the protograph may be permuted (e.g., using a cyclic permutation or any other permutation, such as randomly) to generate from the Z disjoint protographs 404 a single bipartite graph (lifted graph) 406.

A graph 408 illustrates using average weights where the metric is determined according to $$\sum_i \overline{w}_i s_i$$

where $\overline{w}_i$ is the average weight that is common for all of the Z lifted check nodes that are lifted from a common "super" check node in an LDPC code implementation based on lifted nodes and having a lifting factor of Z. As illustrated, the super check node 1 has a value s1, includes Z check nodes 1.1, 1.2, . . . , 1.Z, and has degree dc (e.g., receives messages from dc variable nodes). The super check node 2 has a value s2, includes Z check nodes 2.1, 2.2, . . . , 2.Z, and has degree dc−1.

In other implementations, such as illustrated in a graph 410, a weight $w_i$ may be separately determined for each check node and the metric may be determined according to $$\sum_i w_i s_i.$$

Each weight $w_i$ may be updated during the decoding procedure. A value of $w_i$ may be lower when at least one variable node that participates in the parity check equation of check node i is not reliable, and a value of $w_i$ may be higher when all variable nodes that participate in the parity check equation are reliable. A variable node may be considered to be reliable or unreliable according to a comparison of the number of unsatisfied checks it participates in as compared to a reliability threshold.

For example, a reliability threshold may be determined and variable nodes that participate in a greater number of satisfied parity checks than the reliability threshold may be considered reliable variable nodes. The reliability threshold can be different for each variable node (for example, the reliability threshold may be based on the degree of a variable node) and may be adjusted from iteration to iteration of the bit-flipping operation. Each check node may include a bit map of $d_c$ entries (where $d_c$ is the number of variable nodes that participate in the parity check equation). Each entry of the bit map may indicate whether the corresponding variable node is considered to be reliable or not (e.g., a '0' value may indicate reliability and a '1' value may indicate unreliability). During the bit-flipping procedure, when checking whether to change a value of a specific variable node, an appropriate weight for each check node may be calculated according to the bit map of the check node. If at least one of the other variable nodes is considered to be not reliable (based on extrinsic information), a lower weight may be determined for the check node. Otherwise, a higher weight is determined for the check node. The bit map of each check node may be updated during the decoding procedure according to the bit flip operations.

Use of individual weights for each check node may provide more accurate bit-flipping decisions as a result of dynamic computation of the weights. However, using "average" weights enables reduced storage space as compared to storing individual weights for each check node. In addition, because average weights may be generated a-priori, weight information may be stored in less expensive read-only memory (ROM) instead of in RAM. Storing check node weight data in ROM instead of RAM may reduce a cost of the decoder 126.

In some implementations, the bit-flipping process may implement a variable node bit-flipping schedule based on the degree of the variable nodes. For example, variable nodes with higher degrees (i.e., that participate in more parity check equations) may be processed before variable nodes with lower degrees. Variable nodes with higher degrees may be considered more reliable due to participating in more parity check equations, and erroneous variable node values may be more easily detected for variable nodes having higher degrees than for variable nodes having lower degrees. By processing higher-degree variable nodes before processing lower-degree variable nodes, "easier" errors may be corrected earlier in the bit-flipping process, reducing a number of remaining errors when lower-degree variable nodes are processed and enabling more accurate bit-flipping decisions for lower-degree variable nodes.

When bit-flipping is determined based on comparing the metric for each variable node (e.g., a count of unsatisfied parity checks) to a corresponding threshold, a possibility exists that all variable nodes retain their values during an iteration of the bit-flipping process, even though errors still exist in the data. In this case, the bit-flipping process may terminate rather than continuing until a pre-set number of iterations have been performed. Alternatively, one or more of the thresholds may be lowered to increase the likelihood that one or more variable nodes may change value during a subsequent iteration of the bit-flipping process.

FIG. 5 depicts a graph 500 illustrating decoding latency based on a signal-to-noise ratio (SNR) (or bit error rate (BER)) according a particular embodiment of the decoder 126 of FIG. 1. A first curve 502 corresponds to latency of decoding by processing received data by the bit-flipping stage 140, followed by decoding the received data at the second stage 142 (e.g., a soft LDPC decoder that uses belief propagation) without using results of the bit-flipping stage 140 (i.e., without using the first stage result data 150 to initialize the second stage 142). A second curve 504 corresponds to latency of decoding by processing received data by the bit-flipping stage 140, followed by decoding the received data at the second stage 142 using results of the bit-flipping stage 140 (e.g., using the bit values of the received data 138 and using the reliability data 154 from the bit-flipping stage 140 based on counts of bit-flips for each bit value).

Both curves 502, 504 illustrate relatively low latency at high SNR values, indicating that decoding latency is primarily governed by decoding success in the bit-flipping stage 140 when the received data 138 has relatively few errors. At decreasing SNR/increasing BER, decoding latency increases as the bit-flipping stage 140 is increasingly unlikely to be successful and decoding completes at the second stage 142. At lower SNR, latency for the first curve 502 exceeds latency for the second curve 504. A latency difference between the first curve 502 and the second curve 504 for a particular SNR indicates a performance improvement during belief-propagation decoding due to improved starting conditions provided by the bit-flipping stage 140.

Additional performance benefits may be provided based on efficient initialization of the second stage 142. For example, a belief-propagation flooding schedule iteration may be extracted from the output of the bit-flipping stage 140, which may improve decoding performance at the second stage 142 under certain BER conditions. To illustrate, a count of unsatisfied check nodes connected to each variable node may be extracted from the bit-flipping stage 140 and used to correct each variable node value at the first iteration of the second stage 142, according to the formula $$Q_v = \text{sign}(Q_{in}) * (|Q_{in}| - R_{cv}(2S_v - d_v))$$

where $d_v$ is the degree of the variable node v, $S_v$ is the number of unsatisfied check nodes connected to the variable node v, $Q_{in}$ is the value received from the channel (e.g., the value of the variable node v in the received data 138), $Q_v$ is the new value calculated to be input to the second stage 142 as the value of the variable node v, and $R_{cv}$ is the message from the check nodes connected to the variable node v. The $R_{cv}$ value can be known in advance.

Similarly, a message passing scheme implemented by the decoder 126 of FIG. 1 may use a flooding schedule for a first iteration, in which in each iteration all the variable nodes, and subsequently all of the check nodes, pass new messages to their neighbors. Belief propagation decoding based on a flooding schedule may be performed as described with respect to pseudocode provided in Table 1.

TABLE 1

Initialization:
    for all $v \in V$, $c \in N(v, G)$ $Q_{vc} \leftarrow P_v$
Iteration:
    for all $c \in C$ (Pass check to variable messages)
        for all $v \in N(c, G)$
            $R_{vc} \leftarrow \phi^{-1}(\Sigma_{v' \in N(c,G) \setminus v} \phi(Q_{v'\,c}))$
        end of loop
    end of loop
    for all $v \in V$ (Pass variable to check messages)
        for all $c \in N(v, G)$
            $Q_{vc} \leftarrow P_v + \Sigma_{c' \in N(v,G) \setminus c} R_{c'v}$
        end of loop
    end of loop
    for all $v \in V$ (Compute a-posteriori LLRs)
        $Q_v \leftarrow P_v + \Sigma_{c \in N(v,G)} R_{cv}$
End of loop When processing at the bit-flipping stage 140 occurs using a first phase where $S_v$ is determined for all variable nodes in parallel, followed by a second phase where bit-flipping decisions are determined for each variable node based on the $S_v$ values, calculations of $Q_v$ for each variable node may be performed while the second phase of the bit-flipping process is ongoing. Thus, processing of bit-flipping determinations for the bit-flipping stage 140 and calculation of updated variable node values $Q_v$ for an initial iteration of the second stage 142 may be performed in parallel, with the latency of the second phase of the bit-flipping process partially or completely masking the latency of the initial belief-propagation flooding iteration. As a result, a first iteration of a full flooding schedule at the second stage 142 may be computed on-the-fly based on the initialization of the bit-flipping stage 140 decoding. Because the first iteration of the second stage 142 may be received "for free," the second stage 142 may start from a more advanced point. Although the second stage 142 may continue to use a flooding schedule after the first iteration, in other implementations the second stage 142 may switch to another schedule, such as a serial decoding schedule, after the first iteration is performed.

Figure 6:
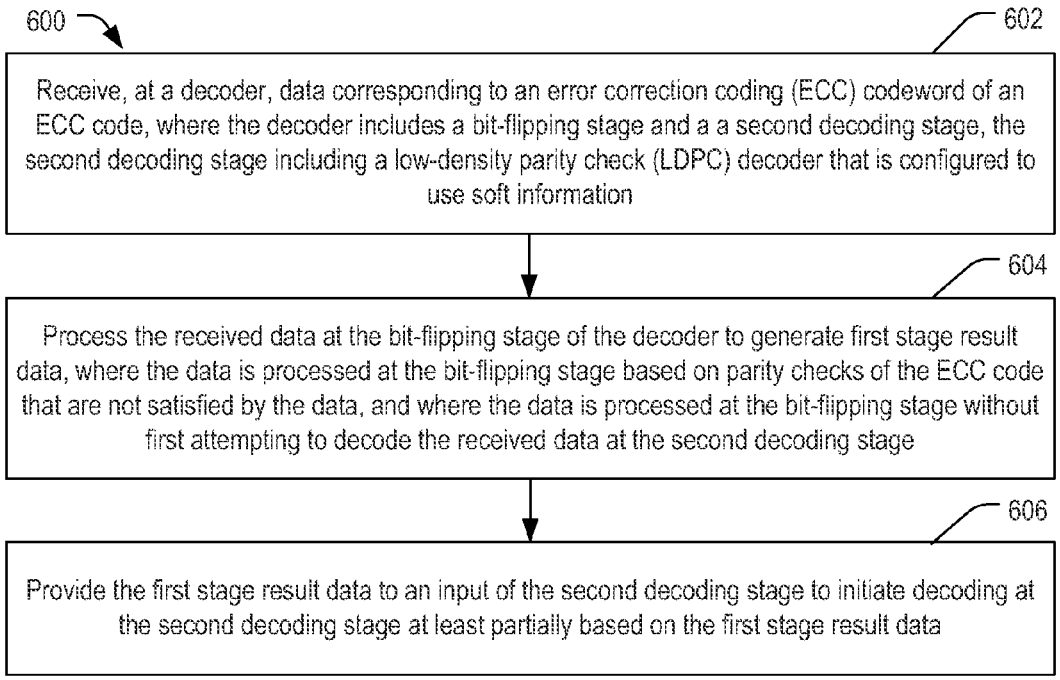
FIG. 6 is a flow chart of a particular illustrative embodiment of a method of decoding data that may be performed at the decoder of FIG. 1.

Referring to FIG. 6, a particular embodiment of a method 600 is depicted. The method 600 may be performed in a data storage device, such as the data storage device 102 of FIG. 1.

The method 600 includes receiving, at a decoder, data corresponding to an error correction coding (ECC) codeword of an ECC code, at 602. The data may match the ECC codeword (i.e., the data is error-free) or the data may be a corrupted version of the ECC codeword (i.e., the data differs from the ECC codeword due to one or more errors). The decoder includes a bit-flipping stage and a second decoding stage. The second decoding stage may include a low-density parity check (LDPC) decoder that is configured to use soft information. For example, the decoder may be the decoder 126 of FIG. 1.

The received data is processed at the bit-flipping stage of the decoder to generate first stage result data, at 604. The data is processed at the bit-flipping stage based on parity checks of the ECC code that are not satisfied by the data. The data is processed at the bit-flipping stage without first attempting to decode the received data at the second decoding stage.

The first stage result data is provided to an input of the second decoding stage to initiate decoding at the second decoding stage at least partially based on the first stage result data, at 606. For example, the first stage result data may include first stage reliability data generated by the bit-flipping stage, such as the reliability data 154 of FIG. 1. Bit values from the received data 138 of FIG. 1 may be provided as initial bit values to the input of the second stage 142 of the decoder 126 of FIG. 1, and the first stage reliability data 154 may be provided as "soft" information to the input of the second stage 142 of the decoder 126 of FIG. 1.

As another example, the first stage result data may include first stage bit values generated by the bit-flipping stage, such as the first stage bit values 152 of FIG. 1. The first stage bit values 152 may be provided as input bit values to the second stage 142 of the decoder 126. In some implementations, reliability data may be received in the received data 138 and provided as "soft" information to the second stage 142. In other implementations, the first stage reliability data 154 may be provided as the "soft" information to the input of the second stage 142 of the decoder 126.

Processing data at the bit-flipping stage may include serially scanning bit values of the received data to determine whether to change a corresponding bit value for each bit position, such as described with respect to the graphs 200, 220, and 230 of FIG. 2. Processing at the bit-flipping stage of the decoder may be terminated in response to a threshold number of iterations of the serial scanning having been performed. For example, the threshold number of iterations may be 1, 2, 3, or any other number of iterations.

In some implementations, serially scanning the bit values includes mapping the bit values of the received data to values of variable nodes of the decoder, such as the variable nodes 202 illustrated in FIG. 2. Serially scanning the bit values may also include determining, for one or more of the variable nodes, whether to change the value of the variable node based on a comparison of a metric to a threshold number. The metric may be determined based on unsatisfied check nodes that are responsive to the variable node. For example, the metric may be a count of the unsatisfied check nodes. As another example, the metric may be a weighted sum corresponding to the unsatisfied check nodes. The weighted sum may be determined by generating, for each particular unsatisfied check node of the unsatisfied check nodes, a product of a value of the particular unsatisfied check node and a weight that corresponds to the particular unsatisfied check node. The generated products may be summed to obtain the weighted sum.

The corresponding threshold number may be determined according to one or more of a variety of techniques, such as described with respect to FIG. 2. For example, the corresponding threshold number may be determined dynamically, such as at least partially based on a reliability value. For example, the corresponding threshold number may be computed in accordance with Equation (1). As another example, the corresponding threshold number may be selected from precomputed sets of threshold values at least partially based on an estimated bit error rate. To illustrate, the estimated bit error rate may be estimated according to an initial syndrome weight at an early stage of decoding.

The serial scanning process may include processing of more than one variable node at a time, such as described with respect to the group 242 of the fourth graph 240 of FIG. 2. When multiple variable nodes are processed as a group, the metric for one variable node may exclude at least one check node that is responsive to the variable node and that is further responsive to a second variable node. For example, the metric for the variable node Vb in the fourth graph 240 of FIG. 2 may exclude the check node Cd because the check node Cd is also responsive to the variable node Vc. A second metric corresponding to the second variable node may also exclude the at least one check node.

In some implementations, the method 600 includes providing an updated count of the unsatisfied check nodes corresponding to each of the variable nodes to the second stage to enable updating of values of the variable nodes during an initial iteration of decoding using the updated counts of the unsatisfied check nodes from the bit-flipping stage. For example, as described above with respect to a two-phase operation of the bit-flipping stage 140, an initial flooding iteration of the second stage 142 may be performed based on $S_v$ values that are determined during the first phase of the bit-flipping stage 140. The initial flooding iteration may be performed concurrently with the second phase of the bit-flipping stage 140.

In some implementations, the second stage decoder is an LDPC decoder implementing belief-propagation. A first iteration of the bit-flipping stage may be equal to the first iteration of the belief-propagation LDPC decoder. The first stage result data that is used as input to the second decoding stage may be the result of the first iteration of the bit-flipping stage. The schedule used by the first iteration of the belief-propagation LDPC decoder may be a flooding schedule.

Figure 7:
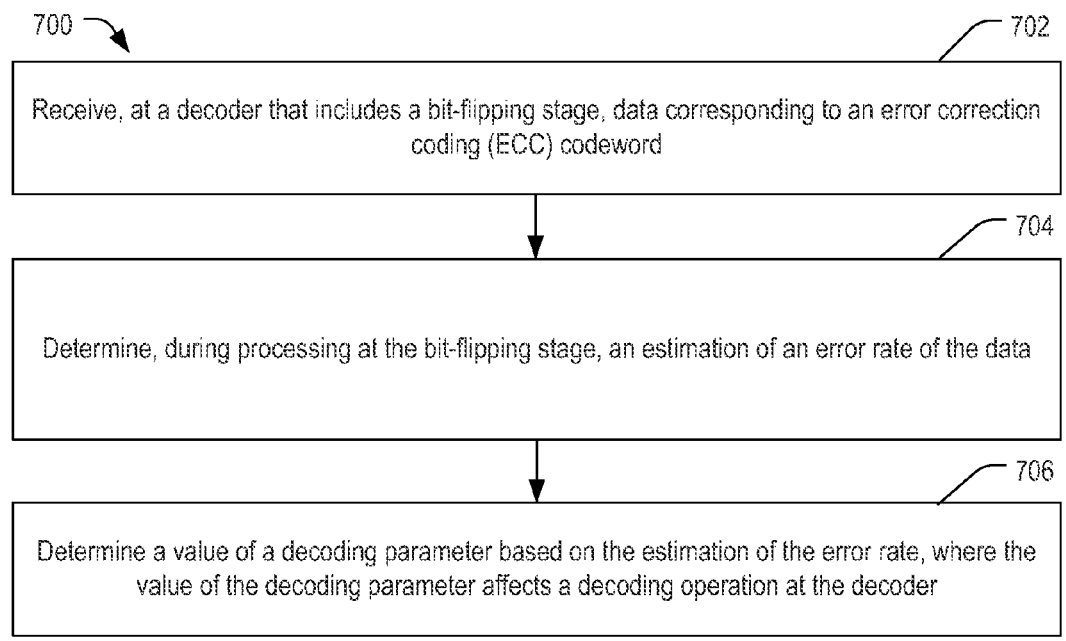
FIG. 7 is a flow chart of another particular illustrative embodiment of a method of decoding data that may be performed at the decoder of FIG. 1.

Referring to FIG. 7, a particular embodiment of a method 700 is depicted. The method 700 may be performed in a data storage device, such as the data storage device 102 of FIG. 1.

The method 700 includes receiving, at a decoder that includes a bit-flipping stage, data corresponding to an error correction coding (ECC) codeword, at 702. For example the data may be the received data 138 received at the bit-flipping stage 140 of FIG. 1.

During processing at the bit-flipping stage, an estimation of an error rate of the data is determined, at 704, and a value of a decoding parameter is determined based on the estimation of the error rate, at 706. The value of the decoding parameter affects a decoding operation at the decoder.

For example, in some implementations, thresholds used for bit-flipping decisions may be calculated on-line based on estimated bit error rate (BER). Processing at the bit-flipping stage includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node, and the threshold number may be determined based on the value of the decoding parameter, which may be determined based on the error rate.

As another example, in some implementations, a set of pre-defined thresholds may be selected from different sets of pre-defined thresholds based on estimated BER. Processing at the bit-flipping stage includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node, and the threshold number may be selected from a set of threshold numbers based on the value of the decoding parameter.

As another example, in some implementations, a threshold (e.g., maximum) number of iterations for decoding at the bit-flipping stage and/or for decoding at a second stage (e.g., the second stage 142 of FIG. 1) may be set based on estimated BER. To illustrate, the value of the decoding parameter may correspond to a threshold number of processing iterations of the bit-flipping stage. The decoder may be configured to terminate the processing at the bit-flipping stage in response to a comparison of a number of processing iterations of the bit-flipping stage to the threshold number of processing iterations. In addition, or alternatively, the decoder may include a second decoding stage that includes a low-density parity check (LDPC) decoder that is configured to use soft information. First stage result data of the bit-flipping stage, such as the first stage result data 150 of FIG. 1, may be provided to the second decoding stage for decode processing. The value of the decoding parameter may correspond to a threshold number of processing iterations of the second decoding stage. The decoder may be configured to terminate the decode processing at the LDPC decoder in response to a comparison of a number of processing iterations of the LDPC decoder to the threshold number of processing iterations.

As another example, in some implementations, initial reliabilities (e.g., LLRs) for decoding at a second stage (e.g., the second stage 142 of FIG. 1) may be determined based on estimated BER. The second decoding stage may include a low-density parity check (LDPC) decoder that is configured to use soft information. First stage result data of the bit-flipping stage may be provided to the second decoding stage for decode processing, and the value of the decoding parameter may correspond to initial reliability information provided to the LDPC decoder.

Figure 8:
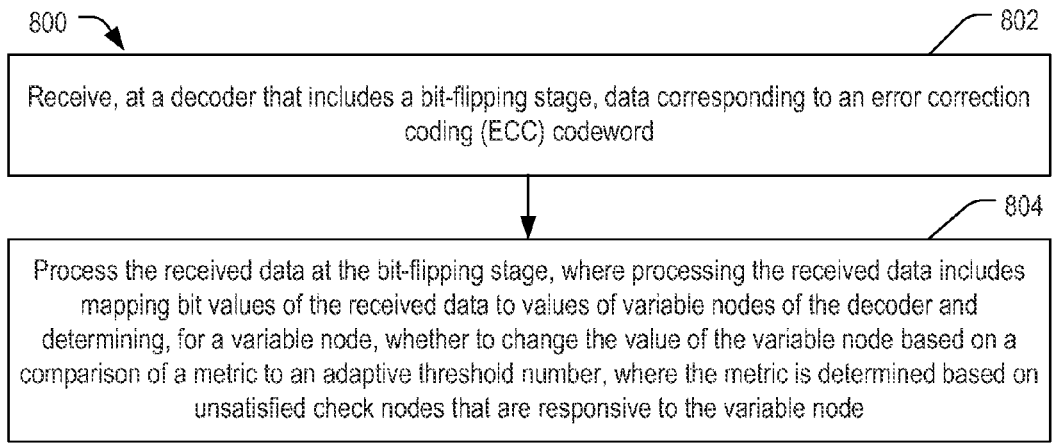
FIG. 8 is a flow chart of another particular illustrative embodiment of a method of decoding data that may be performed at the decoder of FIG. 1.

Referring to FIG. 8, a particular embodiment of a method 800 is depicted. The method 800 may be performed in a data storage device, such as the data storage device 102 of FIG. 1.

The method 800 includes receiving, at a decoder that includes a bit-flipping stage, data corresponding to an error correction coding (ECC) codeword, at 802. For example the data may be the received data 138 received at the bit-flipping stage 140 of FIG. 1.

The received data is processed at the bit-flipping stage, at 804. Processing the received data includes mapping bit values of the received data to values of variable nodes of the decoder and determining, for a variable node, whether to change the value of the variable node based on a comparison of a metric to an adaptive threshold number. The metric is determined based on unsatisfied check nodes that are responsive to the variable node.

The adaptive threshold number may be determined online or offline. For example, the adaptive threshold number may be calculated during the processing of the received data at the bit-flipping stage. As another example, the adaptive threshold number may be selected from a set of threshold numbers. The adaptive threshold number may be determined based on an estimated error rate of the data, such as an estimated BER.

The adaptive threshold number may be determined based on bad-column indices. For example, the adaptive threshold number may be determined at least partially based on information corresponding to columns of storage elements of a memory of the data storage device that are identified as being unreliable, such as indicated in the BC-RAM 172 of FIG. 1.

The adaptive threshold number may be determined at least partially based on soft bit information that is read from a memory of the data storage device. For example, the adaptive threshold number may be at least partially based on soft bit data in the SB-RAM 170 of FIG. 1.

The adaptive threshold number may be defined for each group of variable nodes that correspond to the same copy in the lifting structure in a QC-LDPC structure. For example, the variable nodes may be connected to check nodes according to a lifted quasi-cyclic low-density parity check (QC-LDPC) structure such as depicted in the graph 410 of FIG. 4. The variable nodes may be grouped according to which variable nodes correspond to a common copy of the lifted QC-LDPC structure, and a distinct adaptive threshold number may be determined for each of the groups of the variable nodes.

Figure 9:
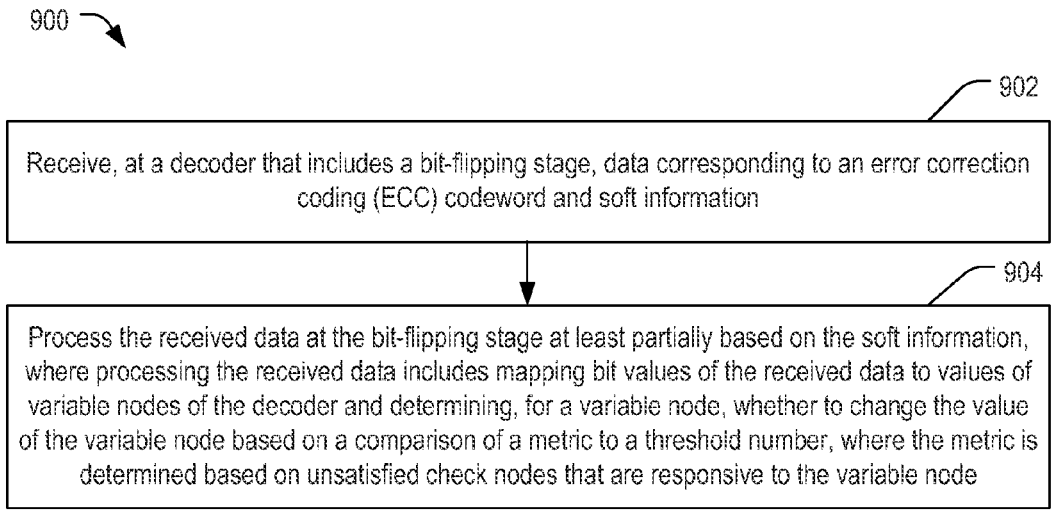
FIG. 9 is a flow chart of another particular illustrative embodiment of a method of decoding data that may be performed at the decoder of FIG. 1.

Referring to FIG. 9, a particular embodiment of a method 900 is depicted. The method 900 may be performed in a data storage device, such as the data storage device 102 of FIG. 1.

The method 900 includes receiving, at a decoder that includes a bit-flipping stage, data corresponding to an error correction coding (ECC) codeword and soft information, at 902. For example the data may be received at the bit-flipping stage 140 of FIG. 1.

The received data is processed at the bit-flipping stage at least partially based on the soft information, at 904. Processing the received data includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node. The soft information may include information corresponding to columns of storage elements of a memory of the data storage device that are identified as being unreliable, such as information provided to the BC-RAM 172 of FIG. 1. Alternatively, or in addition, the soft information may include soft bit information that is read from a memory of the data storage device, such as information provided to the SB-RAM 170 of FIG. 1. The threshold number may be determined at least partially based on the "bad column" information and/or the soft bit information.

Figure 10:
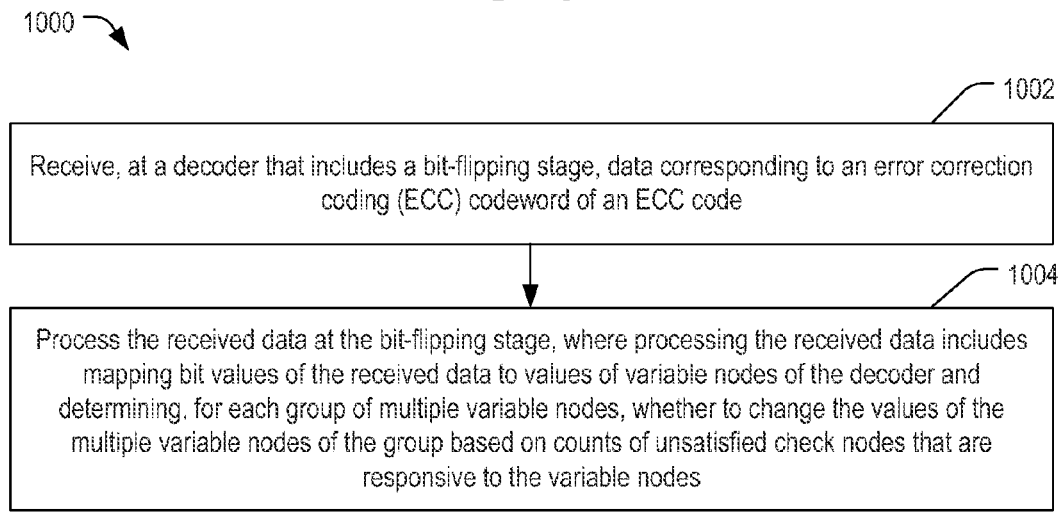
FIG. 10 is a flow chart of another particular illustrative embodiment of a method of decoding data that may be performed at the decoder of FIG. 1.

Referring to FIG. 10, a particular embodiment of a method 1000 is depicted. The method 1000 may be performed in a data storage device, such as the data storage device 102 of FIG. 1. The method 1000 includes receiving, at a decoder that includes a bit-flipping stage, data corresponding to an error correction coding (ECC) codeword, at 1002. For example the data may be received at the bit-flipping stage 140 of FIG. 1.

The received data is processed at the bit-flipping stage, at 1004. Processing the received data includes mapping bit values of the received data to values of variable nodes of the decoder and determining, for each group of multiple variable nodes, whether to change the values of the multiple variable nodes of the group based on counts of unsatisfied check nodes that are responsive to the variable nodes. For example, determining whether to change the values may be performed as described with respect to the graph 240 of FIG. 2. The decoder may also include a second decoding stage that includes a low-density parity check (LDPC) decoder that is configured to use soft information, such as the second stage 142 of FIG. 1. First stage result data generated at the bit-flipping stage may be provided to an input of the second decoding stage to initiate decoding at the second decoding stage at least partially based on the first stage result data.

Although various components depicted herein are illustrated as block components and described in general terms, such components may include one or more microprocessors, state machines, or other circuits configured to enable the decoder 126 of FIG. 1 to perform initial decode processing at the bit-flipping stage 140 prior to performing belief-propagation decode processing at the second stage 142. For example, the decoder 126 may represent physical components, such as hardware controllers, state machines, logic circuits, or other structures, to enable the decoder 126 of FIG. 1 to perform initial decode processing at the bit-flipping stage 140 prior to performing belief-propagation decode processing at the second stage 142. The decoder 126 may also represent physical components to provide results of the bit-flipping stage 140 to initialize decoding at the second stage 142.

The decoder 126 may be implemented using a microprocessor or microcontroller programmed to receive data, to provide the data to the bit-flipping stage 140 to perform initial decode processing at the bit-flipping stage 140 prior to attempting to decode the data at the second stage 142. The microprocessor or microcontroller is further programmed to, after processing at the bit-flipping stage 140, provide results of the bit-flipping stage 140 to an input of the second stage 142 to initialize decoding at the second stage 142.

In a particular embodiment, the decoder 126 includes a processor executing instructions that are stored at the non-volatile memory 104. Alternatively, or in addition, instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached to or embedded within one or more host devices, such as within a housing of a host communication device. For example, the data storage device 102 may be within a packaged apparatus such as a wireless telephone, a tablet computer, a laptop computer, a personal digital assistant (PDA), a gaming device or console, a portable navigation device, or other device that uses internal non-volatile memory. In a particular embodiment, the data storage device 102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device, performing:
receiving, at a decoder, data corresponding to an error correction coding (ECC) codeword of an ECC code, wherein the decoder includes a bit-flipping stage and a second decoding stage, the second decoding stage including a low-density parity check (LDPC) decoder that is configured to use soft information;
processing the received data at the bit-flipping stage of the decoder to generate first stage result data, wherein the data is processed at the bit-flipping stage based on parity checks of the ECC code that are not satisfied by the data, and wherein the data is processed at the bit-flipping stage without first attempting to decode the received data at the second decoding stage; and
providing the first stage result data to an input of the second decoding stage to initiate decoding at the second decoding stage at least partially based on the first stage result data.

2. The method of claim 1, wherein the received data includes received bit values, wherein the first stage result data includes first stage reliability data generated by the bit-flipping stage, and wherein the received bit values and the first stage reliability data are provided to the input of the second decoding stage of the decoder to initiate the decoding partially based on the received data and partially based on the first stage result data.

3. The method of claim 1, wherein the received data includes received reliability data, wherein the first stage result data includes first stage bit values generated by the bit-flipping stage, and wherein the received reliability data and the first stage bit values are provided to the input of the second decoding stage of the decoder to initiate the decoding partially based on the received data and partially based on the first stage result data.

4. The method of claim 1, wherein the first stage result data includes first stage bit values and first stage reliability data generated by the bit-flipping stage, and wherein the first stage bit values and the first stage reliability data are provided to the input of the second decoding stage of the decoder to initiate the decoding based on the first stage result data.

5. The method of claim 1, wherein processing data at the bit-flipping stage of the decoder includes serially scanning bit values of the received data to determine whether to change a corresponding bit value for each bit position.

6. The method of claim 5, wherein serially scanning the bit values includes:
mapping the bit values of the received data to values of variable nodes of the decoder; and
determining, for a variable node, whether to change the value of the variable node based on a comparison of a metric to a threshold number, wherein the metric is determined based on unsatisfied check nodes that are responsive to the variable node.

7. The method of claim 6, wherein the metric is a count of the unsatisfied check nodes or a weighted sum corresponding to the unsatisfied check nodes, wherein the weighted sum is determined by:
generating, for each particular unsatisfied check node of the unsatisfied check nodes, a product of a value of the particular unsatisfied check node and a weight that corresponds to the particular unsatisfied check node; and
summing the generated products to obtain the weighted sum.

8. The method of claim 6, wherein the metric excludes at least one check node that is responsive to the variable node and that is further responsive to a second variable node, and wherein a second metric corresponding to the second variable node excludes the at least one check node.

9. The method of claim 6, further comprising providing an updated count of the unsatisfied check nodes corresponding to each of the variable nodes to the second decoding stage to enable updating of values of the variable nodes during an initial flooding iteration of belief-propagation decoding using the updated counts of the unsatisfied check nodes from the bit-flipping stage.

10. The method of claim 1, wherein the LDPC decoder implements belief propagation, wherein a first iteration of the bit-flipping stage is equal to a first iteration of the belief propagation LDPC decoder, and wherein the first stage result data used as input of the second decoding stage is a result of the first iteration of the bit-flipping stage.

11. The method of claim 10, wherein the first iteration of the belief propagation LDPC decoder uses a flooding schedule.

12. The method of claim 1, wherein the second decoding stage implements belief-propagation.

13. The method of claim 1, wherein the data storage device further includes:
a non-volatile memory having a three-dimensional (3D) configuration that is monolithically formed in one or more physical levels of arrays of memory cells having an active area above a silicon substrate; and
circuitry associated with operation of the memory cells.

14. A method comprising:
in a data storage device, performing:
receiving, at a decoder that includes a bit-flipping stage, data corresponding to an error correction coding (ECC) codeword;
determining, during processing at the bit-flipping stage, an estimation of an error rate of the data; and
determining a value of a decoding parameter based on the estimation of the error rate, wherein the value of the decoding parameter affects a decoding operation at the decoder.

15. The method of claim 14, wherein the processing at the bit-flipping stage includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node, and wherein the threshold number is determined based on the value of the decoding parameter.

16. The method of claim 14, wherein the processing at the bit-flipping stage includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node, and wherein the threshold number is selected from a set of threshold numbers based on the value of the decoding parameter.

17. The method of claim 14, wherein the value of the decoding parameter corresponds to a threshold number of processing iterations of the bit-flipping stage and wherein the decoder is configured to terminate the processing at the bit-flipping stage in response to a comparison of a number of processing iterations of the bit-flipping stage to the threshold number of processing iterations.

18. The method of claim 14, wherein the decoder includes a second decoding stage, the second decoding stage including a low-density parity check (LDPC) decoder that is configured to use soft information, wherein first stage result data of the bit-flipping stage is provided to the second decoding stage for decode processing, wherein the value of the decoding parameter corresponds to a threshold number of processing iterations of the second decoding stage, and wherein the decoder is configured to terminate the decode processing at the LDPC decoder in response to a comparison of a number of processing iterations of the LDPC decoder to the threshold number of processing iterations.

19. The method of claim 14, wherein the decoder includes a second decoding stage, the second decoding stage including a low-density parity check (LDPC) decoder that is configured to use soft information, wherein first stage result data of the bit-flipping stage is provided to the second decoding stage for decode processing, and wherein the value of the decoding parameter corresponds to initial reliability information provided to the LDPC decoder.

20. A method comprising:
in a data storage device, performing:
receiving, at a decoder that includes a bit-flipping stage, data corresponding to an error correction coding (ECC) codeword; and
processing the received data at the bit-flipping stage, wherein processing the received data includes mapping bit values of the received data to values of variable nodes of the decoder and determining, for a variable node, whether to change the value of the variable node based on a comparison of a metric to an adaptive threshold number, wherein the metric is determined based on unsatisfied check nodes that are responsive to the variable node.

21. The method of claim 20, wherein the adaptive threshold number is calculated during the processing of the received data at the bit-flipping stage.

22. The method of claim 20, wherein the adaptive threshold number is selected from a set of threshold numbers.

23. The method of claim 20, wherein the adaptive threshold number is determined based on a state of a storage element of a memory of the data storage device.

24. The method of claim 20, wherein the adaptive threshold number is determined based on a logical page storing the received data in a memory of the data storage device.

25. The method of claim 20, wherein the adaptive threshold number is determined based on a state of a storage element and further based on a logical page storing the received data in a memory of the data storage device.

26. The method of claim 20, wherein the adaptive threshold number for a particular iteration of a bit-flipping operation is determined based on a previous iteration of the bit-flipping operation.

27. The method of claim 20, wherein the adaptive threshold number is determined based on an estimated error rate of the data.

28. The method of claim 20, wherein the adaptive threshold number is determined at least partially based on information corresponding to columns of storage elements of a memory of the data storage device that are identified as being unreliable.

29. The method of claim 20, wherein the adaptive threshold number is determined at least partially based on soft bit information that is read from a memory of the data storage device.

30. The method of claim 20, wherein the variable nodes are connected to check nodes according to a lifted quasi-cyclic low-density parity check (QC-LDPC) structure, wherein the variable nodes are grouped according to which variable nodes correspond to a common copy of the lifted QC-LDPC structure, and wherein a distinct adaptive threshold number is determined for each of the groups of the variable nodes.

31. A method comprising:
in a data storage device, performing:
receiving, at a decoder that includes a bit-flipping stage, data corresponding to an error correction coding (ECC) codeword and soft information; and
processing the received data at the bit-flipping stage at least partially based on the soft information, wherein processing the received data includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node and wherein the threshold number is at least partially based on the soft information.

32. The method of claim 31, wherein the soft information includes information corresponding to columns of storage elements of a memory of the data storage device that are identified as being unreliable.

33. The method of claim 31, wherein the soft information includes soft bit information that is read from a memory of the data storage device.

34. A method comprising:
in a data storage device, performing:
receiving, at a decoder that includes a bit-flipping stage, data corresponding to an error correction coding (ECC) codeword of an ECC code; and
processing the received data at the bit-flipping stage, wherein processing the received data includes mapping bit values of the received data to values of variable nodes of the decoder and determining, for each group of multiple variable nodes, whether to change the values of the multiple variable nodes of the group based on counts of unsatisfied check nodes that are responsive to the variable nodes.

35. The method of claim 34, wherein the decoder further includes a second decoding stage that includes a low-density parity check (LDPC) decoder that is configured to use soft information, and wherein first stage result data generated at the bit-flipping stage is provided to an input of the second decoding stage to initiate decoding at the second decoding stage at least partially based on the first stage result data.

36. A data storage device comprising:
a memory; and
a controller coupled to the memory, wherein the controller includes a decoder that includes a bit-flipping stage and a second decoding stage, the second decoding stage including a low-density parity check (LDPC) decoder that is configured to use soft information, wherein the decoder is configured to receive data corresponding to an error correction coding (ECC) codeword of an ECC code read from the memory and to process the received data at the bit-flipping stage to generate first stage result data, wherein the decoder is configured to process the data at the bit-flipping stage based on parity checks of the ECC code that are not satisfied by the data, wherein the decoder is configured to process the data at the bit-flipping stage without first attempting to decode the received data at the second decoding stage, and wherein the decoder is configured to provide the first stage result data to an input of the second decoding stage to initiate decoding at the second decoding stage at least partially based on the first stage result data.

37. The data storage device of claim 36, wherein the received data includes received bit values, wherein the first stage result data includes first stage reliability data generated by the bit-flipping stage, and wherein the received bit values and the first stage reliability data are provided to the input of the second decoding stage of the decoder to initiate the decoding partially based on the received data and partially based on the first stage result data.

38. The data storage device of claim 36, wherein the received data includes received reliability data, wherein the first stage result data includes first stage bit values generated by the bit-flipping stage, and wherein the received reliability data and the first stage bit values are provided to the input of the second decoding stage of the decoder to initiate the decoding partially based on the received data and partially based on the first stage result data.

39. The data storage device of claim 36, wherein the first stage result data includes first stage bit values and first stage reliability data generated by the bit-flipping stage, and wherein the first stage bit values and the first stage reliability data are provided to the input of the second decoding stage of the decoder to initiate the decoding based on the first stage result data.

40. The data storage device of claim 36, wherein processing data at the bit-flipping stage of the decoder includes serially scanning bit values of the received data to determine whether to change a corresponding bit value for each bit position.

41. The data storage device of claim 40, wherein serially scanning the bit values includes mapping the bit values of the received data to values of variable nodes of the decoder and determining, for a variable node, whether to change the value of the variable node based on a comparison of a metric to a threshold number, wherein the metric is determined based on unsatisfied check nodes that are responsive to the variable node.

42. The data storage device of claim 41, wherein the metric is a count of the unsatisfied check nodes or a weighted sum corresponding to the unsatisfied check nodes, wherein the weighted sum is determined by generating, for each particular unsatisfied check node of the unsatisfied check nodes, a product of a value of the particular unsatisfied check node and a weight that corresponds to the particular unsatisfied check node, and summing the generated products to obtain the weighted sum.

43. The data storage device of claim 41, wherein the metric excludes at least one check node that is responsive to the variable node and that is further responsive to a second variable node, and wherein a second metric corresponding to the second variable node excludes the at least one check node.

44. The data storage device of claim 41, wherein the decoder is configured to provide an updated count of the unsatisfied check nodes corresponding to each of the variable nodes to the second decoding stage to enable updating of values of the variable nodes during an initial flooding iteration of belief-propagation decoding using the updated counts of the unsatisfied check nodes from the bit-flipping stage.

45. The data storage device of claim 36, wherein the LDPC decoder implements belief propagation, wherein a first iteration of the bit-flipping stage is equal to a first iteration of the belief propagation LDPC decoder, and wherein the first stage result data used as input of the second decoding stage is a result of the first iteration of the bit-flipping stage.

46. The data storage device of claim 45, wherein the first iteration of the belief propagation LDPC decoder uses a flooding schedule.

47. The data storage device of claim 36, wherein the second decoding stage implements belief-propagation.

48. The data storage device of claim 36, wherein the memory includes a non-volatile memory having a three-dimensional (3D) configuration that is monolithically formed in one or more physical levels of arrays of memory cells having an active area above a silicon substrate and wherein the memory further includes circuitry associated with operation of the memory cells.

49. A data storage device comprising:
a memory; and
a controller coupled to the memory, wherein the controller includes a decoder that includes a bit-flipping stage, wherein the decoder is configured to receive data corresponding to an error correction coding (ECC) codeword of an ECC code read from the memory and to determine, during processing at the bit-flipping stage, an estimation of an error rate of the data, and wherein the decoder is further configured to determine a value of a decoding parameter based on the estimation of the error rate, wherein the value of the decoding parameter affects a decoding operation at the decoder.

50. The data storage device of claim 49, wherein the processing at the bit-flipping stage includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node, and wherein the threshold number is determined based on the value of the decoding parameter.

51. The data storage device of claim 49, wherein the processing at the bit-flipping stage includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node, and wherein the threshold number is selected from a set of threshold numbers based on the value of the decoding parameter.

52. The data storage device of claim 49, wherein the value of the decoding parameter corresponds to a threshold number of processing iterations of the bit-flipping stage and wherein the decoder is configured to terminate the processing at the bit-flipping stage in response to a comparison of a number of processing iterations of the bit-flipping stage to the threshold number of processing iterations.

53. The data storage device of claim 49, wherein the decoder includes a second decoding stage, the second decoding stage including a low-density parity check (LDPC) decoder that is configured to use soft information, wherein first stage result data of the bit-flipping stage is provided to the second decoding stage for decode processing, wherein the value of the decoding parameter corresponds to a threshold number of processing iterations of the second decoding stage, and wherein the decoder is configured to terminate the decode processing at the LDPC decoder in response to a comparison of a number of processing iterations of the LDPC decoder to the threshold number of processing iterations.

54. The data storage device of claim 49, wherein the decoder includes a second decoding stage, the second decoding stage including a low-density parity check (LDPC) decoder that is configured to use soft information, wherein first stage result data of the bit-flipping stage is provided to the second decoding stage for decode processing, and wherein the value of the decoding parameter corresponds to initial reliability information provided to the LDPC decoder.

55. A data storage device comprising:
a memory; and
a controller coupled to the memory, wherein the controller includes a decoder that includes a bit-flipping stage, wherein the decoder is configured to receive data corresponding to an error correction coding (ECC) codeword read from the memory and to process the received data at the bit-flipping stage, wherein processing the received data includes mapping bit values of the received data to values of variable nodes of the decoder and determining, for a variable node, whether to change the value of the variable node based on a comparison of a metric to an adaptive threshold number, wherein the metric is determined based on unsatisfied check nodes that are responsive to the variable node.

56. The data storage device of claim 55, wherein the adaptive threshold number is calculated during the processing of the received data at the bit-flipping stage.

57. The data storage device of claim 55, wherein the adaptive threshold number is selected from a set of threshold numbers.

58. The data storage device of claim 55, wherein the adaptive threshold number is determined based on a state of a storage element of the memory.

59. The data storage device of claim 55, wherein the adaptive threshold number is determined based on a logical page storing the received data in the memory.

60. The data storage device of claim 55, wherein the adaptive threshold number is determined based on a state of a storage element and further based on a logical page storing the received data in the memory.

61. The data storage device of claim 55, wherein the adaptive threshold number for a particular iteration of a bit-flipping operation is determined based on a previous iteration of the bit-flipping operation.

62. The data storage device of claim 55, wherein the adaptive threshold number is determined based on an estimated error rate of the data.

63. The data storage device of claim 55, wherein the adaptive threshold number is determined at least partially based on information corresponding to columns of storage elements of a memory of the data storage device that are identified as being unreliable.

64. The data storage device of claim 55, wherein the adaptive threshold number is determined at least partially based on soft bit information that is read from a memory of the data storage device.

65. The data storage device of claim 55, wherein the variable nodes are connected to check nodes according to a lifted quasi-cyclic low-density parity check (QC-LDPC) structure, wherein the variable nodes are grouped according to which variable nodes correspond to a common copy of the lifted QC-LDPC structure, and wherein a distinct adaptive threshold number is determined for each of the groups of the variable nodes.

66. A data storage device comprising:
a memory; and
a controller coupled to the memory, wherein the controller includes a decoder that includes a bit-flipping stage, wherein the decoder is configured to receive data corresponding to an error correction coding (ECC) codeword and soft information read from the memory and to process the received data at the bit-flipping stage at least partially based on the soft information, wherein processing the received data includes mapping bit values of the received data to values of variable nodes of the decoder and determining, for a variable node, whether to change the value of the variable node based on a comparison of a metric to a threshold number, wherein the metric is determined based on unsatisfied check nodes that are responsive to the variable node and wherein the threshold number is at least partially based on the soft information.

67. The data storage device of claim 66, wherein the soft information includes information corresponding to columns of storage elements of a memory of the data storage device that are identified as being unreliable.

68. The data storage device of claim 66, wherein the soft information includes soft bit information that is read from a memory of the data storage device.

69. A data storage device comprising:
a memory; and
a controller coupled to the memory, wherein the controller includes a decoder that includes a bit-flipping stage, wherein the decoder is configured to receive data corresponding to an error correction coding (ECC) codeword from the memory and to process the received data at the bit-flipping stage, wherein processing the received data includes mapping bit values of the received data to values of variable nodes of the decoder and determining, for each group of multiple variable nodes, whether to change the values of the multiple variable nodes of the group based on counts of unsatisfied check nodes that are responsive to the variable nodes.

70. The data storage device of claim 69, wherein the decoder further includes a second decoding stage that includes a low-density parity check (LDPC) decoder that is configured to use soft information, and wherein first stage result data generated at the bit-flipping stage is provided to an input of the second decoding stage to initiate decoding at the second decoding stage at least partially based on the first stage result data.

* * * * *